United States Patent

Gaynes et al.

(10) Patent No.: US 6,199,751 B1
(45) Date of Patent: Mar. 13, 2001

(54) POLYMER WITH TRANSIENT LIQUID PHASE BONDABLE PARTICLES

(75) Inventors: Michael A. Gaynes, Vestal; Kostas I. Papathomas; Giana M. Phelan, both of Endicott; Charles G. Woychik, Vestal, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/533,196

(22) Filed: Mar. 23, 2000

Related U.S. Application Data

(62) Division of application No. 09/086,399, filed on May 28, 1998, now Pat. No. 6,087,021.

(51) Int. Cl.[7] .......................... B23K 20/00; B23K 28/00; B23K 31/00; B23K 31/02; B23K 7/00
(52) U.S. Cl. .................... 228/195; 228/175; 228/180.22; 228/198; 428/546; 428/637; 428/672; 428/673; 428/674
(58) Field of Search .................................. 228/195, 175, 228/194, 180.22, 198; 428/546, 637, 328, 570, 403, 407, 626, 672, 673, 674

(56) References Cited

U.S. PATENT DOCUMENTS 5,038,996   8/1991   Wilcox et al. .
5,432,998   7/1995   Galasco et al. .
5,466,302   11/1995  Carey et al. .
5,542,602   8/1996   Gaynes et al. .

Primary Examiner—Patrick Ryan
Assistant Examiner—Colleen Cooke
(74) Attorney, Agent, or Firm—William N. Hogg

(57) ABSTRACT

A technique of forming a metallurgical bond between pads on two surfaces is provided. A metal coating placed on each surface includes a first metal base layer and a second metal surface layer. The first and second metals include a low melting point constituent. A first ratio of the two metals forms a liquid phase with a second ratio of the two metals forming a solid phase. The volume of the base layer metal exceeds the volume necessary to form the solid phase between the base metal and the surface metal. Conductive metal particles are provided having a core metal and a coating metal dispersed in an uncured polymer material, at a volume fraction above the percolation threshold. The core metal and the coating metal together include a low melting point constituent. At a first ratio the components form a liquid phase and at a second ratio the two components form a solid phase. The polymer containing particles is placed between the two metal surfaces with the particles interfacing with each other and the surface layer of metal. The structure is heated to a temperature higher than the low melting liquid constituent to form a liquid phase which extends to include the surface of the pads and the surface of the particles, and thereafter form a solid phase by diffusion of the core material into the surface material and the base metal into the coating material.

12 Claims, 3 Drawing Sheets

POLYMER WITH TRANSIENT LIQUID PHASE BONDABLE PARTICLES

CROSS REFERENCE TO RELATED APPLICATION

This application is a divisional of application Ser. No. 09/086,399, filed May 28, 1998 now U.S. Pat. No. 6,087,021.

BACKGROUND OF THE INVENTION

1. Field of Invention

The present invention relates generally to the formation of electrically conductive metallurgical bonds using components having a low melting point constituent and more particularly to a technique for using conductive metal particles having a low melting point constituent in a polymer binder to form a metallurgical bond both between the metal particles themselves and the particles and metal pads on opposing substrates to form a homogenous isotropic electrical connection between the metal pads on the substrates.

2. Background Information

Solder, for many years has been the material of choice in many instances for forming mechanical and electrical bonds between metals such as pads or contacts in electrical circuitry. Solder has been particularly useful in forming bonds between raised pads on two substrates such as joining metal pads on a semi-conductor chip to pads on a chip carrier or circuit board. In such technology, solder is applied to one or both of the pads and caused to melt or reflow and then solidify to form the bond.

Another technique for forming connections between metal pads on opposed substrates, is by the use of conductive adhesives. Such conductive adhesives usually include a high concentration of conductive particles in a thermal setting or thermal plastic binder. Achieving good electrical conductivity in the case of conductive adhesives in the past has depended upon generating sufficient compressive forces between the particles to maintain an intimate surface contact therebetween and at the same time generating sufficient compressive force on the particles against the metal pads on each of the substrates. Such compressive forces are generally obtained through volume shrinkage as the thermal setting binder cures or through solidification of a thermal plastic binder upon cooling after reflow. However, in the case of conductive adhesives, the adhesive is subject to a tendency to creep during thermal cycling and as a result the compressive force may be reduced or lost and hence the mechanical contact between some of the particles may be broken or contact between some of the particles and the pads may be broken, thus resulting in either the total loss of conductivity or substantial increase in the resistance.

A technique for generating metallurgical bonds of a certain type between particles in an adhesive polymer binder or between particles and pads is disclosed in U.S. Pat. No. 5,542,602 issued Aug. 6, 1996 and commonly assigned herewith, and which patent is hereby incorporated herein by reference. In the '602 patent, two different techniques of forming metallurgical bonds each using transient liquid phase (TLP) bonding are shown. In one technique particles having a core material with a coated material on the top thereof and which metals react to form a eutectic are disposed in the adhesive and bonded to each other by means of TLP bonding. This forms a conductive matrix in the polymer after the adhesive has cured or set. In another technique uncoated metal particles are utilized, which form a mono layer between the two pads being joined and an isotropic bond is formed by a TLP reaction between uncoated balls and a coating of metal on the pads to form the eutectic and then a liquid and then a solid phase is formed by the TLP reaction.

In the case of the coated metal balls, a good metallurgical homogeneous metallurgical network is formed with the particles, but a good bond between the homogeneous network and the pads on the opposed substrates is now assured. In the other embodiment wherein the uncoated particles are utilized a good metallurgical bond between the pads is obtained by the use of the uncoated balls but this is limited to a closely spaced isotropic connection with a separation between the pads being required to be no more than a mono layer of the conductive particles.

Therefore, it is desired and a principal objective of this invention to provide a solid metallurgical network of a conductive material connecting pads on adjacent substrates by utilizing TLP technique both for bonding the conductive particles in an adhesive and between the particles and metal on the pads.

SUMMARY OF THE INVENTION

According to the present invention, a method of forming a metallurgical bond between pads on two opposed surfaces and a resulting structure formed thereby are provided. The method includes placing a metal coating on each of said surfaces wherein said metal coating includes a base layer of a first metal and a surface layer of a second metal and wherein said first and second metals include a low melting point constituent which preferably is a eutectic of the metals, but which can be a low melting point surface layer metal. A first ratio of the two metals forms a liquid phase with a second ratio of the two metals forming a solid phase. The volume of the base layer metal exceeds the volume necessary to form the solid phase between said base metal and the surface layer metal. Conductive metal particles are provided having a core metal and a coating metal coated thereon and wherein the core metal and the coating metal together include a low melting point constituent. At a first ratio the components form a liquid phase and at a second ratio the two components form a solid phase. The particles are dispersed in an uncured curable polymer material, at a volume fraction above the percolation threshold. (As used herein cure of a polymer is meant to include not only the curing of a the thermoset resin upon heating, but also the melting and solidification of the thermoplastic resins.) The polymer with the particles dispersed therein is placed between the two metal surfaces with a major portion of the particles interfacing with each other and with particles interfacing with the surface layer of metal on each of the surfaces. The structure is then is heated to a temperature which is higher than the low melting liquid constituent to thereby form a liquid phase at both of the pad and the particles and forming a liquid phase which extends to include the surface of the pads and the surface of the particles, and thereafter form a solid phase by diffusion of the core material into the surface material and the base metal into the coating material. Thus, a solid isotropic metallurgical bond between the particles themselves and the particles and the metal surfaces is formed by TLP bonding.

Preferably the base material and the core material are the same material and the coating material and the surface material are the same material to thereby form a single liquid phase and single solid phase. The core metals and the base metals preferably are copper, silver or gold and the coating material preferably is tin or indium, with copper being the preferred base and core material and tin being the preferred surface and coating material.

DESCRIPTION OF THE PREFERRED EMBODIMENT(s)

Figure 1:
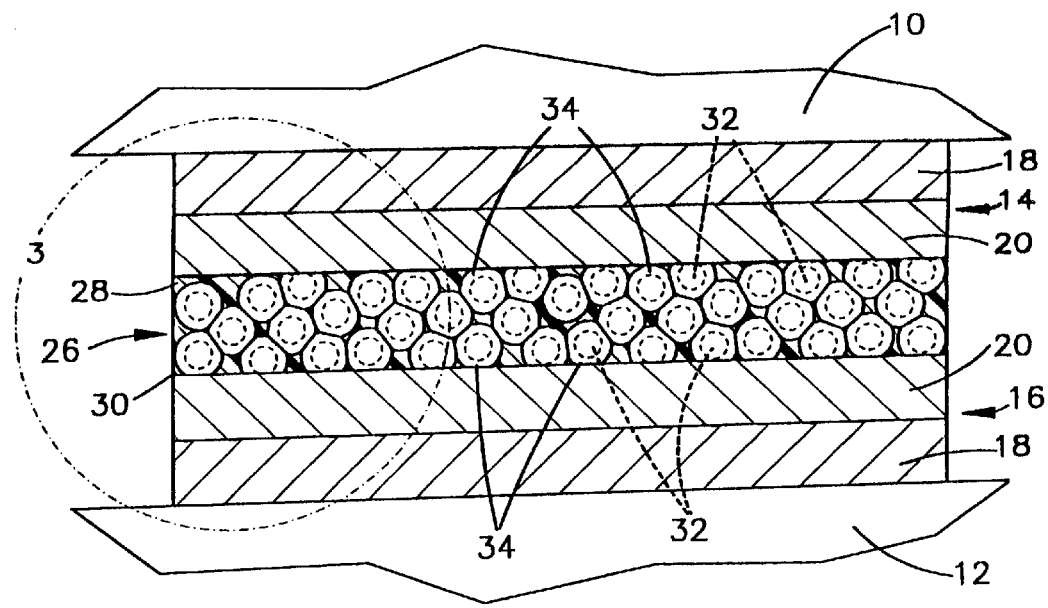
FIG. 1 is a longitudinal sectional view somewhat diagrammatic showing conductive adhesive disposed between two contacts on two opposed substrates prior to heating to form a metallurgical interconnection.

The present invention provides for the formation of a strong solid metallurgical bond between contacts on adjacent substrates wherein the metallurgical bond has been formed utilizing a low melting point constituent, preferably components that form eutectics. In the present invention, contacts on the substrates are provided that include two components having a low melting point constituent which is either one of the components or is a eutectic formed between the two components. An adhesive which is preferably a thermal set or thermal plastic resin is provided in which are dispersed conductive particles. The particles preferably are generally spherical and are mixed to a high concentration, i.e. a volume fraction above the percolation threshold in the resin. The particles also are formed of two separate components, a core material and a coating material, which provides a low melting point constituent which is either the coating material or a eutectic of the two metals. The adhesive with the particles dispersed therein is interposed between the contacts with a major fraction of the particles in contact with each other and a substantial portion of the particles in contact with one or the other of the contacts. The structure, at this point, is heated to a temperature above the melting point of the low melting point component or the eutectic to allow the low melting point constituent to become liquid, and maintained at this temperature until the entire outer coating of the particles and the surface coating of the contacts become totally liquid and thus form a liquid metallurgical bond between the particles themselves and the particles and the contacts. This temperature is also high enough to reflow or set (cure) the resin of the adhesive and thus apply compressive pressure to the particles. Continued heating at this temperature will cause the remaining material in the core and then the base layer of the contacts diffuse to the liquid phase causing it to solidify as a continuous solid phase thereby providing a continuous solid phase metallurgical interconnection between the opposing contacts.

The above described process will be described in detail with the reference to the FIGS. 1–5. Referring now co FIG. 1 a pair of substrates 10 and 12 are provided which typically will be dielectric material or semi-conductor material although many different types of substrates with contacts thereon can be joined. A typical process would be for the substrate 10 to be an IC Chip and substrate 12 to be the substrate of a chip carrier. Formed on the substrate 10 are contacts 14 and on the substrate 12 are contacts 16. Each of the contacts 14 and 16 is comprised of two layers of material. The dual layer includes a base layer 18 and a surface layer 20.

The present process, as indicated above, can utilize two components which together form a low melting eutectic or two components one of which has a significantly lower melting point than the other. Both the eutectic form and the low melting point component are referred to as being a low melting point constituent which in one case is the eutectic and in the other a low melting point component. Indeed both conditions may exist for certain combinations of metal components. For example, the base layer 18 can be copper, gold or silver and the surface layer tin or Indium, all of which form eutectics and in both cases have a low melting point component. The following description with respect to FIGS. 1–5 will describe materials which form a eutectic.

A conductive adhesive designated generally as 26 is disposed between the contacts 14 and 16. The conductive adhesive includes a matrix resin material 28 which is preferably a polymer, for example a thermo setting or thermo plastic resin 28. The resin 28 has disposed therein conductive particles 30. As indicated above there should be sufficient conductive particles 30 to exceed the percolation threshold.

Each of the particles 30 includes a core material 32 and a coating material 34. While the size of the particles is not critical, it has been found that particles with the core material 32 being about 10 to 15 microns in diameter, and the coating material 34 being about 1.0 to 1.5 microns thick, are particularly suitable. The core material 32 and coating material 34 are selected such that they form a low melting eutectic. For example, the core material 32 preferably can be copper, gold or silver and the coating material 34 can be indium or tin which as indicated above all form eutectics In the preferred embodiment the core material 32 is the same as the base material 18 and the coating material 34 is the same as the surface material 20. Particularly suitable for this is copper as the core material 32 and base material 18 and tin as the surface material 20 and coating material 34. In any event the core and coating materials form low melting point eutectics, i.e. a composition at which the melting point is lower than the melting point of either of the component elements. The copper/indium system exhibits a eutectic having a melting point of 153° C. The copper/tin system exhibits a eutectic which has a melting point of 227° C. The silver/indium system has a eutectic melting point of 141° C. The silver/tin system has a eutectic melting point of 221° C.

Figure 2:
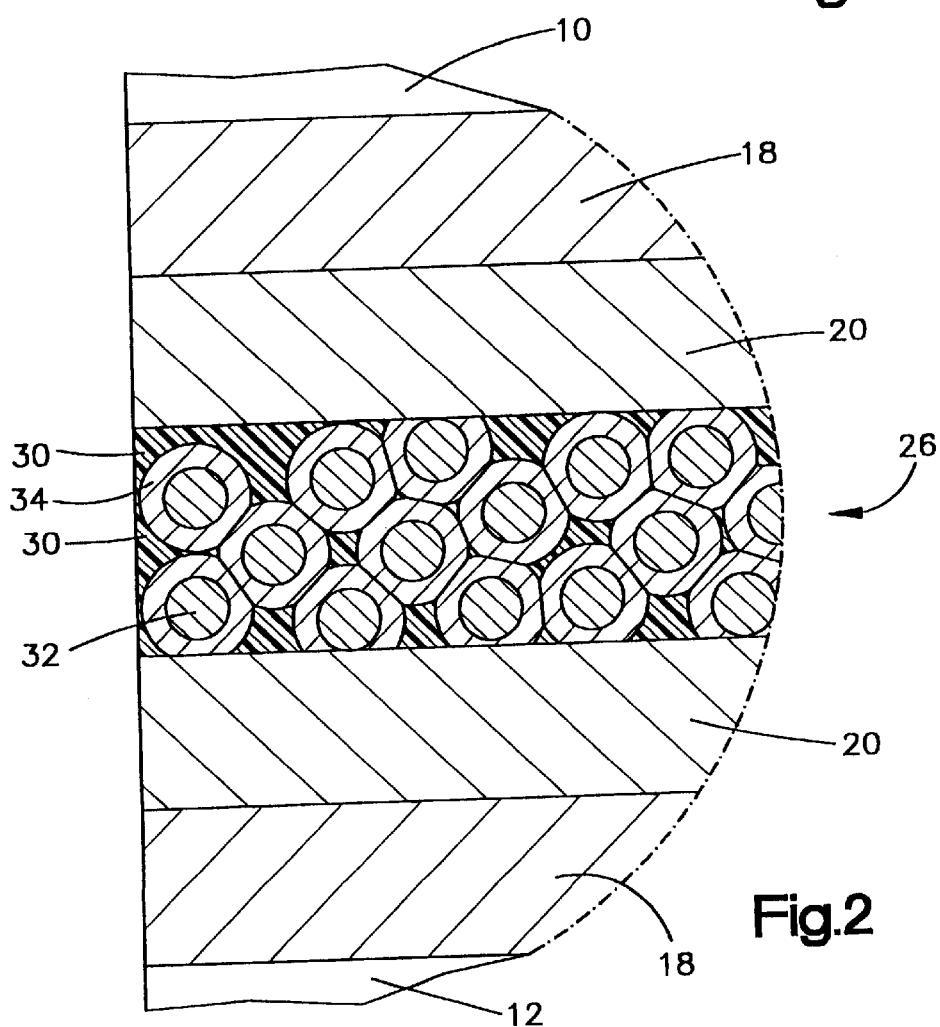
FIG. 2 is an enlarged view of the portion of FIG. 1 shown in the circle showing heating to cure the polymer.

In order to form a metallurgical bond between the particles 30 themselves and between the particles 30 and the contacts 14 and 16, the structure as shown in FIG. 1 is heated to a temperature slightly above (e.g. 5°–15° C.) the eutectic of the highest of either the eutectic of the particles 30 or the eutectic of the contacts 14 and 16. In the preferred embodiment which utilizes copper as the base layer 18 and the core material 32 and tin as the surface layer 20 and the coating material 34. This temperature should be between about 232° and 242° C. The heating will cause the resin 28 to cure, i.e. if it is a thermal set resin it will set on heating and if it is a thermal plastic resin, it will cure by joining reflow of the material during the heating process. This cure will take place before the transient liquid phase reaction is completed and will apply a compressive force to the particles 26 as shown in FIG. 2.

Figure 3:
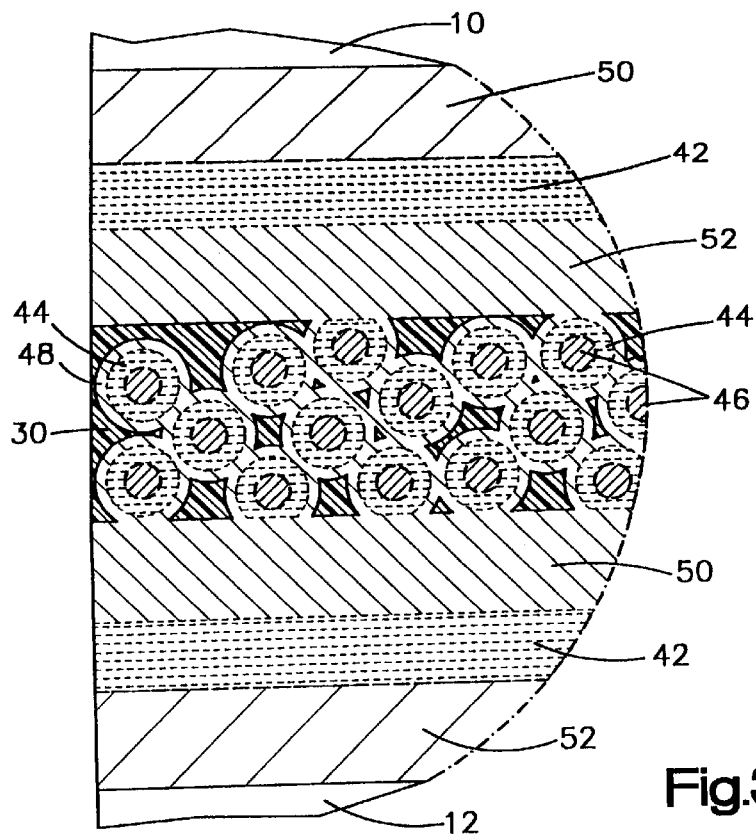
FIG. 3 is a view similar to FIG. 2, showing the initial formation of liquid phases of a eutectic during transient liquid phase bonding.

Upon heating to temperatures slightly above the eutectic and which in the case of a copper/tin system for both the particles and the contacts, the first thing that happens after the resin cures is that a eutectic liquid will form between the base layers 18 and surface layer 20 on both of the contacts 14 and 16 as shown at 42 between the light and heavy dashed lines and also a liquid eutectic layer will form at the interface of the coating material 34 and the core material 32 on each of the particles 30 as indicated at 44 between the heavy dashed lines and the light dashed lines as shown in FIG. 3. Thus each of the particles at this early stage of heating initially forms a liquid eutectic phase 44 surrounding a solid copper core and surrounded by a solid outer tin coating, the solid core being designated as 46 and the solid outer coating being designated as 48. Similarly, the contacts 14 an 16 each have the eutectic liquid phase 42 which is liquid bounded on one side by a solid phase copper 50 and a solid phase tin 52.

Figure 4:
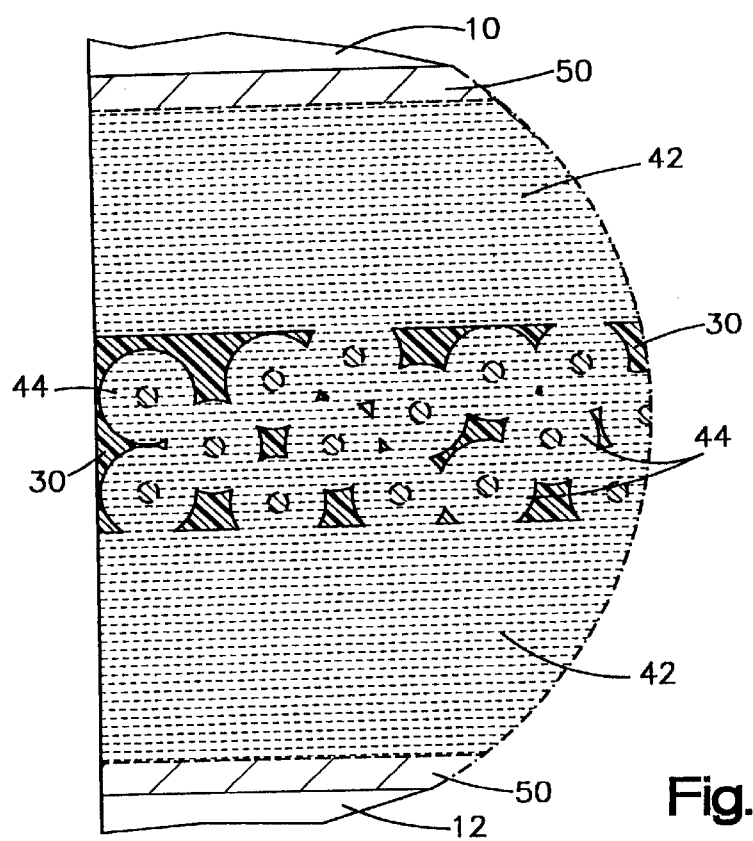
FIG. 4 is a view similar to FIG. 3 showing the completion of the formation of the liquid phases with the contacts and the particles in the resin.

As the heating continues, the liquid phase 42 between the solid phase 50 and 52 continues to grow until the entire outer surface layer of the contacts 14 and 16 are liquid phase and the liquid phase 44 continues to grow until entire outer surface layer of each of the conductive particles 30 is liquid phase whereas the core of the particles remains solid phase copper and the remainder of the base of the contacts remain solid phase copper. This is shown in FIG. 4 wherein there is essentially a complete homogeneity achieved between the liquid phases of the particles and the liquid phases of the contacts.

Figure 5:
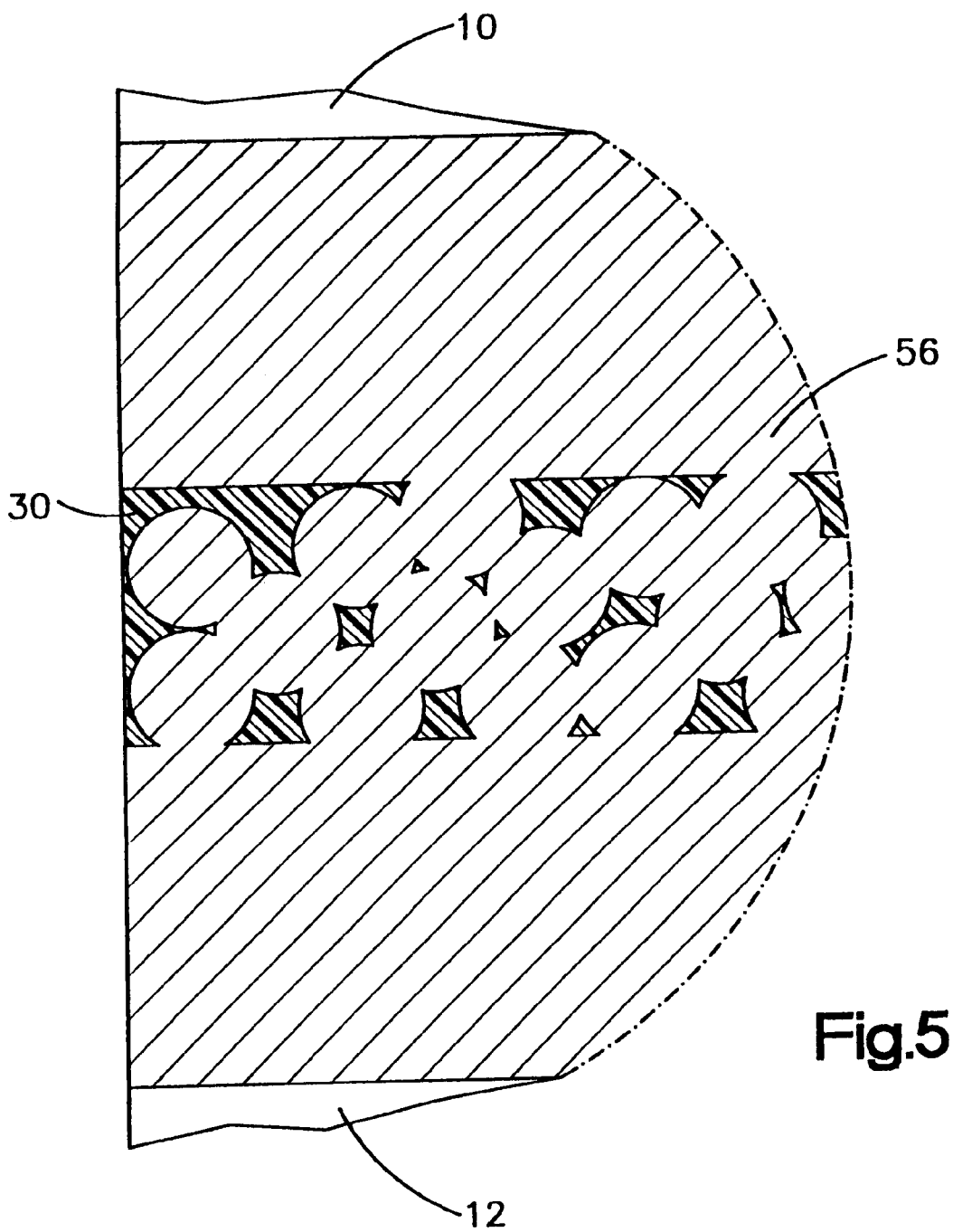
FIG. 5 shows the final structure of a completed solid phase isotropic metallurgical bond as a result of the continued heating of the liquid phase to form the complete solid phase metallurgical interconnection by transient liquid phase bonding.

It should be noted at this point, that initially there was substantially more copper in both the core 32 of the particle and the base layer 18 of the contacts than necessary to form the eutectic and that additional alloying of the liquid phase eutectic with the copper will transform the liquid eutectic phase into a solid phase. Continued heating of the structure at this point causes the copper from the solid phase 50 of the copper in the contact to diffuse into the liquid eutectic 42 formed on the surface of each of the contacts and also to cause the solid phase copper 46 in the center of each of the particles to diffuse into the outer liquid phase eutectic coating 44, thereby transforming the liquid eutectic phase into a solid non-eutectic phase 56 in both cases which is shown in FIG. 5. Thus as can be seen in FIG. 5, there is an essentially continuous solid phase isotropic metallurgical bond between all of the conductive particles and each of the contacts. Expressed another way, the contacts and the conductive particles in this final stage are essentially a unitary solid phase without interfaces providing a strong isotropic bond with the bond being reinforced by a resin 30.

As indicated earlier, essentially the same results can be achieved by utilizing component systems for the contact pads and the particles which have a low melting point component as the surface layer and coating layer and a high melting point component as the core and the base layer. By using a low melting point component and a high melting point component for both of the contacts and for the conductive particles, even if no eutectic is formed, if the higher melting component can diffuse into the lower melting component while it is a liquid and allow it to solidify at a constant temperature at which the liquid phase becomes solid transient liquid phase bonding can be achieved. For example, a low melting point coating metal could be coated on to a higher melting point core and metal to form the particle and a low melting point metal used as a surface material layer on a higher melting point material used as a base layer for each of the contacts. In such a case, the mechanism of joining is similar to but just slightly different from the mechanism previously described. In this case upon heating, the entire coating metal of the particle would melt at its melting temperature as would the surface layer of the metal on the contact. This would form a liquid phase of material over solid phase on the particles and a liquid phase on top of a solid phase on the contacts. These liquids would mix, i.e. the liquids on the surfaces of particles would mix and those liquids on the surface of the particles would come into contact with the liquid on the surfaces on the contacts and would mix forming a unitary liquid phase. Continued heating would cause the core material of the particle and the base material of the contacts to diffuse into this liquid phase thereby causing it to solidify just as in the case of eutectic transient liquid phase bonding. The result would be essentially the same, i.e. a substantially continuous solid phase of material which includes both of the contacts and the interconnecting material formed from the particles, which particles are no longer discrete particles, but a network of solid phase material between the two contacts.

What is claimed is:

1. A method of forming a metallurgical bond between two surfaces comprising the steps of;

placing at least one metal contact on each of said surfaces wherein each metal contact includes a base layer of a first metal and a surface layer of a second metal, and wherein said first and second metals form a low melting point constituent, and wherein said volume of said surface layer metal exceeds the volume necessary to form said low melting point constituent and the volume of said base layer exceeds that necessary to form a solid phase alloy with said surface layer, forming conductive metal particles having a core metal and a coating metal coated thereon wherein said core metal and said coating metal form a low melting point constituent wherein the volume of said coating metal exceeds the amount of metal needed to form said low melting point constituent and the volume of said core metal exceeds that necessary to form a solid phase alloy with said coating layer, dispersing said particles in an uncured curable polymer material, placing said polymer material with said particles dispersed therein between the contacts on said two surfaces, with a major portion of said particle interfacing with each other and with particles interfacing with the surface layer of metal of said contacts, and heating the polymer and the metal particles and the contacts to a temperature which is higher than the higher of the melting point of said low melting point constituent but low enough to first form a liquid phase at each interface and thereafter form a solid phase by a transient liquid phase process to thereby form a solid isotropic metallurgical bond between the particles themselves and the particles and the contacts.

2. The invention as defined in claim 1 wherein each of the base layers metal and the surface layer metal form a eutectic, and wherein said core metal and said coating metal form a eutectic.

3. The invention as defined in claim 2 wherein said core metal and said base metal are selected from the group of Cu, Ag, and Au and the coating metals and surface metals are selected from the group of Sn and In.

4. The invention as defined in claim 3 wherein the base metal and the core metal are the same.

5. The invention as defined in claim 3 wherein the surface metal and the coating metal are the same.

6. The invention as defined in claim 5 wherein the base metal and the core metal are the same.

7. The invention as defined in claim 1 wherein the polymer is a thermoset resin.

8. The invention as defined in claim 1 wherein the polymer is a thermoplastic resin.

9. The invention as defined in claim 3 wherein the base metal is Cu.

10. The invention as defined in claim 9 wherein the surface metal is Sn or In.

11. The invention as defined in claim 9 wherein the core metal is Cu.

12. The invention as defined in claim 11 wherein the coating metal is Sn or In.

* * * * *